United States Patent
Wu

(10) Patent No.: US 7,656,329 B2
(45) Date of Patent: Feb. 2, 2010

(54) TIME-INTERLEAVED ANALOG-TO-DIGITAL CONVERSION APPARATUS

(75) Inventor: Shang-Hsiu Wu, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 33 days.

(21) Appl. No.: 12/175,469

(22) Filed: Jul. 18, 2008

(65) Prior Publication Data

US 2009/0256734 A1 Oct. 15, 2009

(30) Foreign Application Priority Data

Apr. 15, 2008 (TW) ............................. 97113615 A

(51) Int. Cl.
*H03M 1/00* (2006.01)
(52) U.S. Cl. ...................... 341/141; 341/155
(58) Field of Classification Search ................ 341/141, 341/155, 118, 120, 119
See application file for complete search history.

(56) References Cited

U.S. PATENT DOCUMENTS 5,568,142 A * 10/1996 Velazquez et al. ........... 341/126
6,452,518 B1 * 9/2002 Kawabata ................... 341/118
7,250,885 B1 * 7/2007 Nairn ......................... 341/141
7,352,316 B2 * 4/2008 Hori et al. .................. 341/155
2008/0024338 A1 * 1/2008 Huang et al. ................ 341/120

* cited by examiner

Primary Examiner—Jean B Jeanglaude
(74) Attorney, Agent, or Firm—Jianq Chyun IP Office

(57) ABSTRACT

A time-interleaved analog-to-digital conversion apparatus is disclosed. The time-interleaved analog-to-digital conversion apparatus is applied for a television system and includes an input multiplexing module, a gain multiplexer and an analog-to-digital converter. The input multiplexing module receives a plurality of image signals, and samples the image signals according to a clock signal to generate a sample multiplexing signal. The gain multiplexer receives a plurality of gain signals and selectively transmits one of the gain signals corresponding to the sample multiplexing signal according to the clock signal, so as to generate a gain multiplexing signal. The analog-to-digital converter receives the sample multiplexing signal, the gain multiplexing signal and the clock signal. The analog-to-digital converter amplifies and converts the sample multiplexing signal to a digital signal according to the gain multiplexing signal and the clock signal.

22 Claims, 7 Drawing Sheets

TIME-INTERLEAVED ANALOG-TO-DIGITAL CONVERSION APPARATUS

CROSS-REFERENCE TO RELATED APPLICATION

This application claims the priority benefit of Taiwan application serial no. 97113615, filed on Apr. 15, 2008. The entirety of the above-mentioned patent application is hereby incorporated by reference herein and made a part of specification.

BACKGROUND OF THE INVENTION

1. Field of the Invention

The present invention relates to an analog-to-digital conversion apparatus. More particularly, the present invention relates to a time-interleaved analog-to-digital conversion apparatus.

2. Description of Related Art

With development of technology, demanding of electronic products is increased accordingly. Besides good qualities and powerful functions of the electronic products, low prices thereof are also important references considered by consumers during purchasing. With quick development of fabrication abilities for electronic devices, working frequencies of the electronic devices are increased accordingly. Therefore, a conventional parallel processing structure having relatively more electronic devices for matching the working frequency thereof is now replaced by a time-interleaved structure which resource are shared, so as to reduce a fabrication cost thereof.

In a digital television system, a plurality of analog-to-digital conversion (ADC) apparatuses are generally applied to capture and digitalize image signals, conventionally. Referring to FIG. 1, FIG. 1 is a block diagram illustrating a multi-channel analog-to-digital conversion apparatus 100 of a conventional television system. Since the image signals include a luminance signal and two chrominance signals, the multi-channel analog-to-digital conversion apparatus 100 accordingly includes three independent analog-to-digital converters 110, 120 and 130. Moreover, the analog-to-digital converters 110, 120 and 130 respectively receive image signals CH1~CH3, and respectively receive gain signals GAIN1~GAIN3 provided by gain digital-to-analog converters 140, 150 and 160 for amplifying conversion results of the analog-to-digital converters 110, 120 and 130. A clock signal Fck provides a working frequency for the analog-to-digital converters 110, 120 and 130.

Since the analog-to-digital conversion apparatus 100 applies a plurality of the analog-to-digital converters 110, 120 and 130, relatively more circuits are applied in the apparatus, and therefore cost thereof is expensive. Thus, based on the conventional technique, another analog-to-digital conversion apparatus applying a time-interleaved technique is provided.

Referring to FIG. 2, FIG. 2 is a block diagram illustrating a time-interleaved analog-to-digital conversion apparatus 200 of a conventional television system. A multiplexer 210 of the conventional time-interleaved analog-to-digital conversion apparatus 200 performs time-division multiplexing to the input image signals CH1~CH3. Therefore, to achieve a function as that does of the analog-to-digital conversion apparatus 100, the conventional time-interleaved analog-to-digital conversion apparatus 200 requires only one analog-to-digital converter 220. However, to reduce the number of the analog-to-digital converters, the time-interleaved analog-to-digital conversion apparatus 200 has to apply a clock signal Fck3 with a relatively high frequency. In a general television system, the working frequency thereof is not high. Therefore the time-interleaved analog-to-digital conversion apparatus 200 can apply the clock signal Fck3 with the relatively high frequency.

However, the analog-to-digital conversion apparatus 200 only applies one gain digital-to-analog generator 230 to generate the amplified gain. Such amplification is to enhance intensities of the image signals, so as to enhance a signal-noise ratio (SNR) thereof. Limited by a bit number of the analog-to-digital converter 220, it is difficult for the same gain to effectively amplify three different image signals. For example, when the luminance signal is relatively great, only a relatively small gain may be applied, so that the probably small chrominance signal cannot be effectively amplified, and therefore the SNR of the chrominance signal is quite low, or even the chrominance signal may be lost.

SUMMARY OF THE INVENTION

The present invention is directed to a time-interleaved analog-to-digital conversion apparatus adapted to a television system. During analog-to-digital conversion of image signals, the analog-to-digital conversion apparatus may provide different gains for amplifying different kind of image signals, so as to increase each SNR thereof.

Embodiments of the present invention provide time-interleaved analog-to-digital conversion apparatuses, which may provide different gains for amplifying different image signals during analog-to-digital conversion of the image signals, so as to increase each SNR thereof.

The present invention provides a time-interleaved analog-to-digital conversion apparatus adapted to a television system, the time-interleaved analog-to-digital conversion apparatus includes an input multiplexing module, a gain multiplexer and an analog-to-digital converter. The input multiplexing module receives a plurality of image signals, and samples the image signals according to a clock signal to generate a sample multiplexing signal. The gain multiplexer is coupled to the input multiplexing module for receiving a plurality of gain signals and selectively outputting one of the gain signals corresponding to the sample multiplexing signal according to the clock signal, so as to generate a gain multiplexing signal. The analog-to-digital converter is coupled to the input multiplexing module and the gain multiplexer for receiving the sample multiplexing signal, the gain multiplexing signal and the clock signal. The analog-to-digital converter converts the sample multiplexing signal into a digital signal according to the gain multiplexing signal and the clock signal.

In an embodiment of the present invention, the image signals include luminance signal, a first chrominance signal and a second chrominance signal.

In an embodiment of the present invention, the input multiplexing module includes a first sample-and-hold (S/H) circuit, a second S/H circuit, a third S/H circuit and a multiplexer. The first S/H circuit receives the luminance signal and samples the luminance signal according to the clock signal to generate a first sample signal. The second S/H circuit receives the first chrominance signal and samples the first chrominance signal according to the clock signal to generate a second sample signal. Similarly, the third S/H circuit receives the second chrominance signal and samples the second chrominance signal according to the clock signal to generate a third sample signal. The multiplexer is coupled to the first, the second and the third S/H circuits for selectively outputting one of the first, the second and the third sample signals according to the clock signal, so as to generate the sample multiplexing signal.

In an embodiment of the present invention, the input multiplexing module includes a multiplexer and an S/H circuit. The multiplexer receives the plurality of image signals and selectively outputs one of the image signals according to the clock signal to generate a multiplexing signal. The S/H circuit is coupled to the multiplexer for sampling the multiplexing signal according to the clock signal to generate the sample multiplexing signal.

In an embodiment of the present invention, the input multiplexing module includes a plurality of S/H circuits and a multiplexer. The S/H circuits receive the image signals and sample the image signals according to the clock signal to generate a plurality of sample signals. The multiplexer is coupled to the S/H circuits for selectively outputting one of the sample signals according to the clock signal to generate the sample multiplexing signal.

In an embodiment of the present invention, the gain signals are all analog signals.

In an embodiment of the present invention, the analog-to-digital conversion apparatus further includes a plurality of gain digital-to-analog converters for receiving a plurality of gain setting signals and converting the gain setting signals to generate the gain signals. Wherein the gain setting signals are all digital signals.

Moreover, the present invention provides another time-interleaved analog-to-digital conversion apparatus including an input multiplexing module, a gain multiplexer and an analog-to-digital converter. The input multiplexing module receives a plurality of input signals, and samples the input signals according to a clock signal to generate a sample multiplexing signal. The gain multiplexer is coupled to the input multiplexing module for receiving a plurality of gain signals and selectively outputting one of the gain signals corresponding to the sample multiplexing signal according to the clock signal, so as to generate a gain multiplexing signal. The analog-to-digital converter is coupled to the input multiplexing module and the gain multiplexer for receiving the sample multiplexing signal, the gain multiplexing signal and the clock signal. The analog-to-digital converter converts the sample multiplexing signal into a digital signal according to the gain multiplexing signal and the clock signal.

The present invention further provides a time-interleaved analog-to-digital conversion apparatus including an input multiplexing module, a gain multiplexer and an analog-to-digital converter. The input multiplexing module receives a plurality of input signals, and multiplexes the input signals according to a clock signal to generate an input multiplexing signal. The gain multiplexer is coupled to the input multiplexing module for receiving a plurality of gain signals and selectively outputting one of the gain signals corresponding to the input multiplexing signal according to the clock signal, so as to generate a gain multiplexing signal. The analog-to-digital converter is coupled to the input multiplexing module and the gain multiplexer for sampling the input multiplexing signal to generate a sample signal. The analog-to-digital converter converts the sample signal into a digital signal according to the gain multiplexing signal and the clock signal.

According to the present invention, during the analog-to-digital conversion, different gains are applied to amplify different kind of signals. Therefore, the SNR during signal transmission may be effectively reduced, and accuracy of the signal may be improved.

In order to make the aforementioned and other objects, features and advantages of the present invention comprehensible, a preferred embodiment accompanied with figures is described in detail below.

DESCRIPTION OF EMBODIMENTS

In the following content, a plurality of embodiments with reference of figures is provided to further describe the present invention, so as to fully convey the spirit of the present invention for those skilled in the art.

Figure 1:
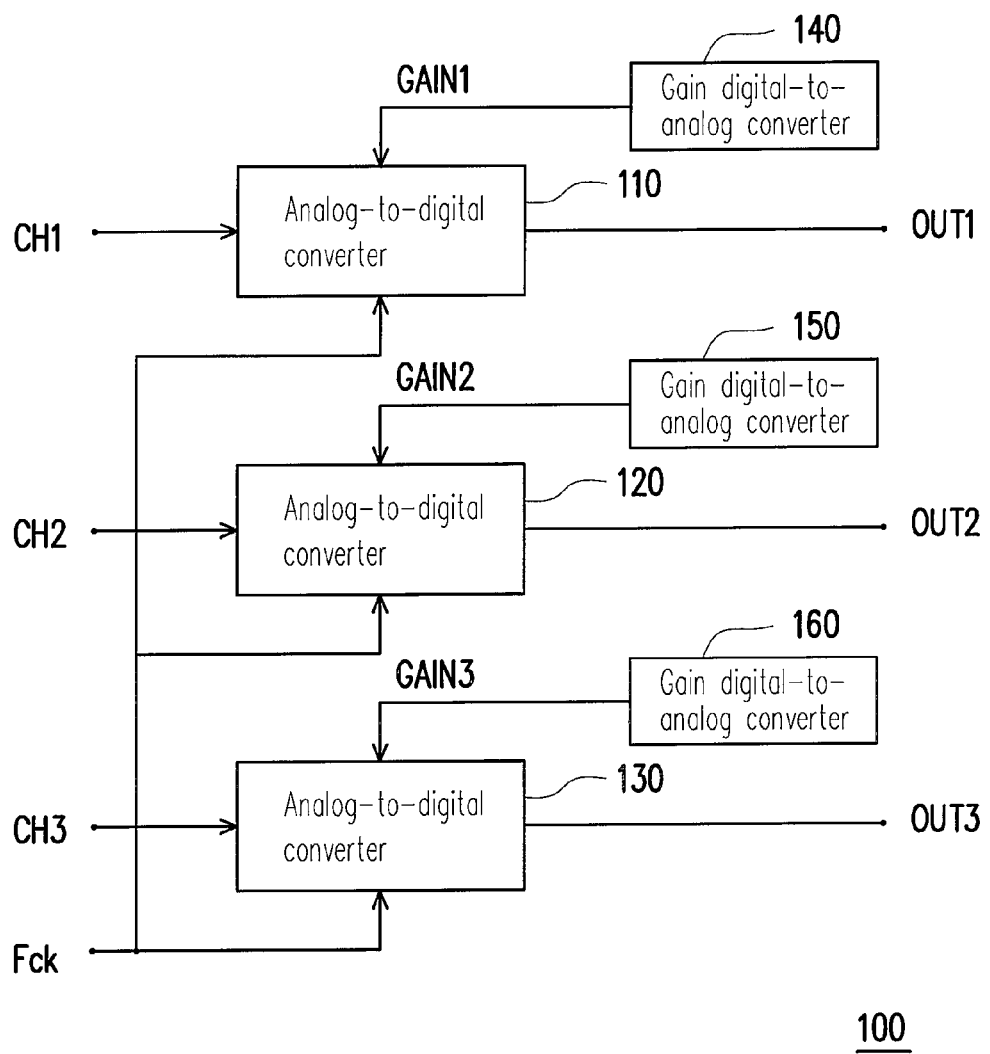
FIG. 1 is a block diagram illustrating a multi-channel analog-to-digital conversion apparatus 100 of a conventional television system.
Figure 2:
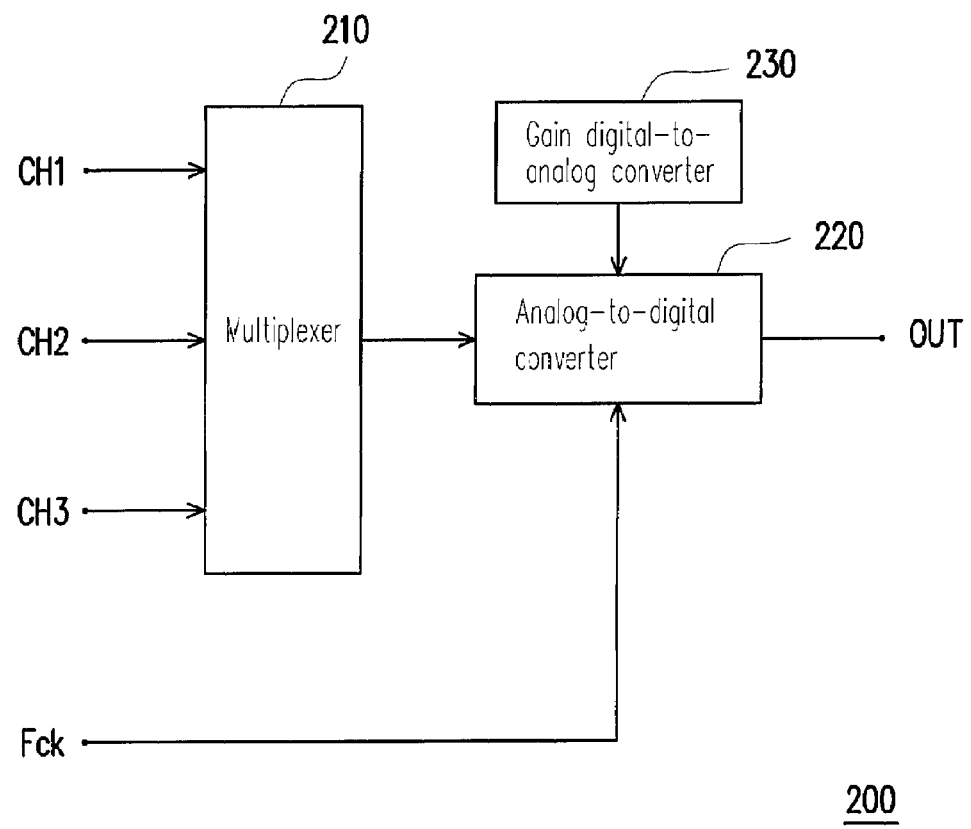
FIG. 2 is a block diagram illustrating a time-interleaved analog-to-digital conversion apparatus 200 of a conventional television system.
Figure 3A:
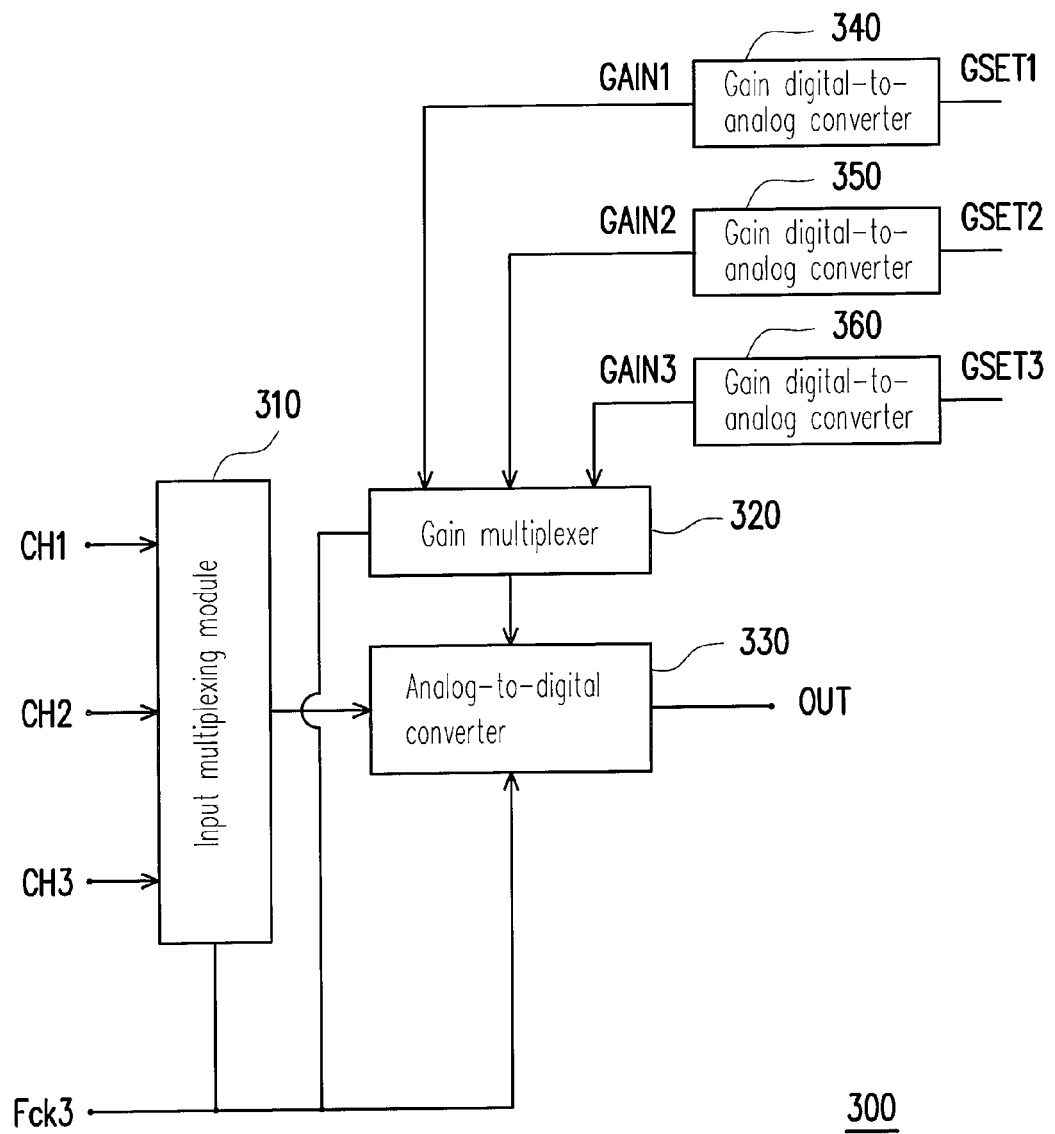
FIG. 3A is a block diagram illustrating a time-interleaved analog-to-digital conversion apparatus 300 according to an embodiment of the present invention.

Referring to FIG. 3A, FIG. 3A is a block diagram illustrating a time-interleaved analog-to-digital conversion apparatus 300 according to an embodiment of the present invention. The analog-to-digital conversion apparatus 300 of the present invention is a time-interleaved analog-to-digital conversion apparatus, which may be applied to a television system (not shown in FIG. 3A) for processing image signals. However, such application is not intended to limit the present invention. The analog-to-digital conversion apparatus 300 includes an input multiplexing module 310, a gain multiplexer 320, an analog-to-digital converter 330 and a plurality of gain digital-to-analog converters 340~360. The input multiplexing module 310 receives and samples the input signals. Taking the television system as an example, the input signals are image signals received by the television system. Generally, the image signals are divided into three parts, which are known as a luminance signal, a first chrominance signal and a second chrominance signal, which may be represented by symbols of Y, Cb and Cr.

In the analog-to-digital conversion apparatus 300, the image signals are respectively transmitted to the input multiplexing module 310 via three channels. In the present embodiment, an image signal CH1 is the luminance signal, an image signal CH2 is the first chrominance signal and an image signal CH3 is the second chrominance signal. Certainly, such corresponding relation of the channels and the signals is not intended to limit the present invention. Since the image signals CH1~CH3 are analog signals directly come from an image capturing device (such as a charge coupled device (CCD), which is not shown), sampling and holding operations have to be performed thereon, so as to generate corresponding three sample signals. The input multiplexing module 310 sequentially transmits the three sample signals to an output terminal thereof according to a clock signal Fck3. Wherein, the so-called "sequentially" does not refer to a certain sequence, and the sequence may be arbitrarily designed by the designer according to actual requirement.

Figure 3B:
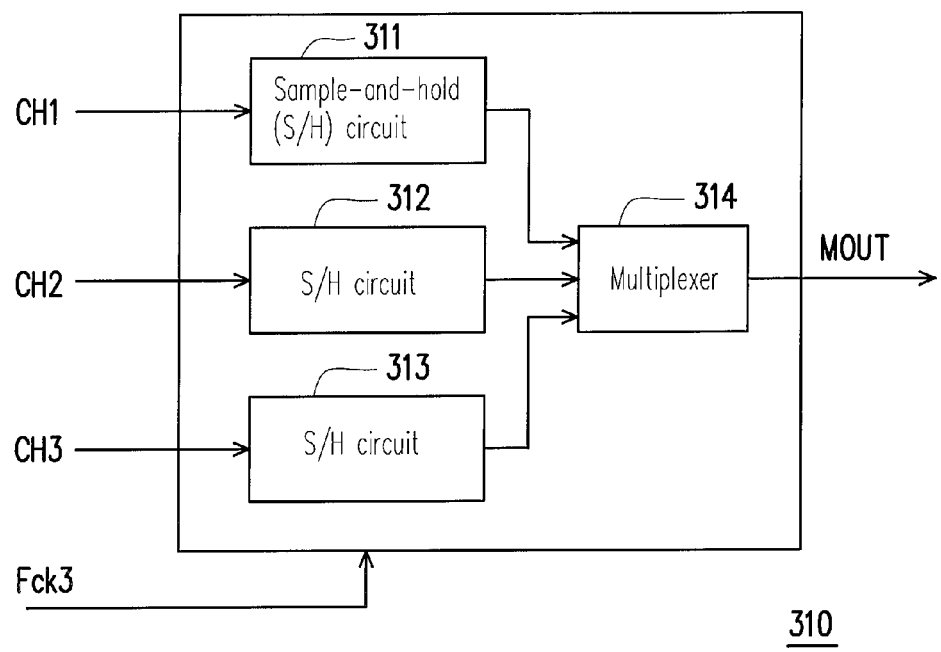
FIGS. 3B, 3C and 3D are block diagrams respectively illustrating a different input multiplexing module 310.
Figure 3C:
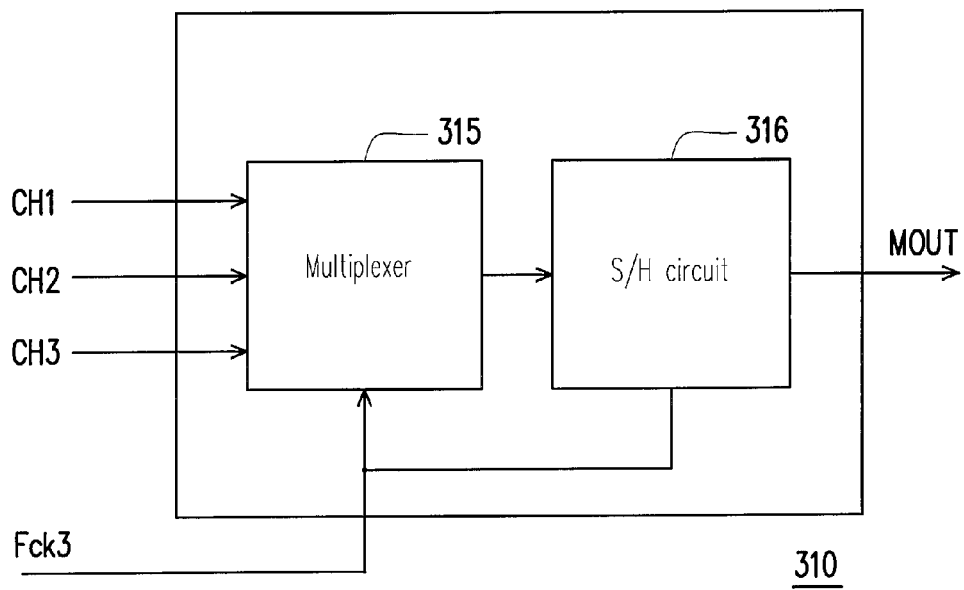

Moreover, referring to FIG. 3B and FIG. 3C, FIG. 3B and FIG. 3C are block diagrams respectively illustrating a different input multiplexing module 310. The input multiplexing module 310 of FIG. 3B includes three S/H circuits 311~313 for respectively receiving the image signals CH1~CH3, and sampling the image signals according to the clock signal Fck3. Then, one of the outputs of the S/H circuits 311~313 is selected by the multiplexer 314 according to the Fck3, and is transmitted to an output terminal MOUT.

Figure 3D:
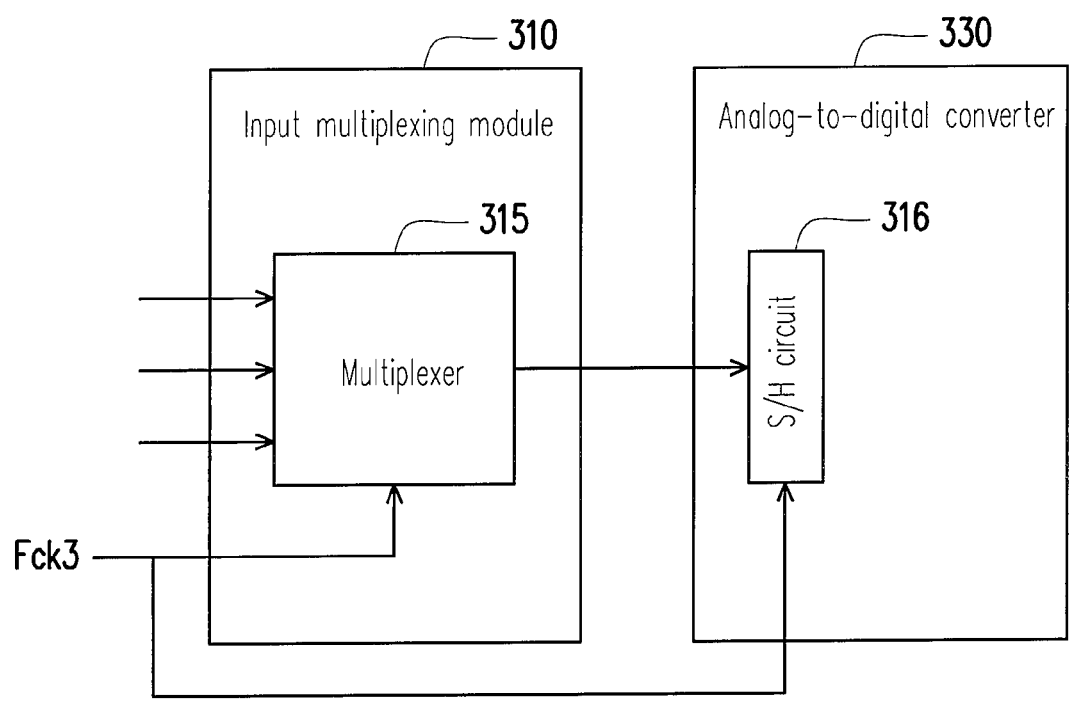

It should be noted that the S/H circuit is not necessarily constructed in the input multiplexing module 310. As shown in FIG. 3D, the S/H circuit 316 is constructed within the rear analog-to-digital converter 330, and only the multiplexer 315 is constructed within the input multiplexing module 310. In this embodiment, the input multiplexing module 310 only performs the multiplexing function, and the sampling and holding operations are performed by the analog-to-digital converter 330.

Referring to FIG. 3B, for a simple example, at a first rising edge trigger (or falling edge trigger) point of the clock signal Fck3, the S/H circuit 311 is selected to sample the image signal CH1; at a second rising edge trigger point of the clock signal Fck3, the S/H circuit 312 is selected to sample the image signal CH2; and at a third rising edge trigger point of the clock signal Fck3, the S/H circuit 313 is selected to sample the image signal CH3.

Moreover, the multiplexer 314 is also not necessarily constructed in the input multiplexing module 310, which may also be constructed in the analog-to-digital converter coupled at the rear of the input multiplexing module 310. That is, in the embodiment, the multiplexing module 310 performs the sampling and holding operations only.

Referring to FIG. 3C, the input multiplexing module 310 of FIG. 3C only includes one multiplexer 315 and one S/H circuit 316. The S/H circuit 316 receives the image signal to be sampled/held that selected by the multiplexer 315 according to the clock signal Fck3. After the S/H circuit 316 samples the signal selected by the multiplexer 315, a sample multiplexing signal is generated at the output terminal MOUT. For example, at the first rising edge trigger (or falling edge trigger) point of the clock signal Fck3, the image signal CH1 is outputted by the multiplexer 315 and thus sampled; at the second rising edge trigger point of the clock signal Fck3, the image signal CH2 is outputted by the multiplexer 315 and thus sampled; and at the third rising edge trigger point of the clock signal Fck3, the image signal CH3 is outputted by the multiplexer 315 and thus sampled.

Moreover, the input multiplexing module 310 may also not include the S/H circuit 316, and the S/H circuit 316 may be constructed to a first stage of the rear analog-to-digital converter (shown as FIG. 3D), and is operated via a time-interleaved approach. In such case, the input multiplexer 310 only has a function of switching paths of the image signals.

Referring to FIG. 3A again, the gain multiplexer 320 of the analog-to-digital conversion apparatus 300 receives gain signals GAIN1~GAIN3. The gain multiplexer 320 selects one of the gain signals GAIN1~GAIN3 to output according to the received clock signal Fck3. For example, at the first rising edge trigger (or falling edge trigger) point of the clock signal Fck3, the gain multiplexer 320 transmits the gain signal GAIN1 to an output terminal thereof; at the second rising edge trigger point of the clock signal Fck3, the gain multiplexer 320 transmits the gain signal GAIN2 to the output terminal thereof; and at the third rising edge trigger point of the clock signal Fck3, the gain multiplexer 320 transmits the gain signal GAIN3 to the output terminal thereof.

The analog-to-digital converter 330 receives the sample multiplexing signal generated by the input multiplexing module 310 and the gain multiplexing signal transmitted by the gain multiplexer 320. The analog-to-digital converter 330 converts the analog sample multiplexing signal into a digital sample multiplexing signal according to the received sample multiplexing signal and the clock signal Fck3. Moreover, the analog-to-digital converter 330 amplifies the converted digital sample multiplexing signal according to the gain multiplexing signal, so as to generate a digital signal OUT.

It should be noted that the gain multiplexing signal selectively output by the gain multiplexer 320 has to be matched to the sample multiplexing signal received by the analog-to-digital converter 330. For example, assuming the gain signals GAIN1~GAIN3 are respectively used for amplifying the sampled and digitalized images signals CH1~CH3. Then, when the input multiplexing module 310 outputs the sample multiplexing signal generated by sampling the image signal CH1, the gain multiplexer 320 has to output the gain signal GAIN1 as the gain multiplexing signal to the analog-to-digital converter 330. Similarly, when the input multiplexing module 310 outputs the sample multiplexing signal generated by sampling the image signal CH2, the gain multiplexer 320 has to output the gain signal GAIN2 as the gain multiplexing signal to the analog-to-digital converter 330. Also, when the input multiplexing module 310 outputs the sample multiplexing signal generated by sampling the image signal CH3, the gain multiplexer 320 has to output the gain signal GAIN3 as the gain multiplexing signal to the analog-to-digital converter 330.

Here, function of the gain signal is described. The gain signal referred herein is a reference voltage of the analog-to-digital converter. For example, if voltage range of the input signal is 0.3V~1.0V, the gain signal then has to be within the range of 0.3V~1.0V. Taking 8 bits as an example, and assuming the voltage range of the gain signal is in accord with that of the input signal. Then, 0.3V is converted to a digital code 0 (represented with a decimal format) after the analog-to-digital conversion, and 1.0V is converted to a digital code 255. If the voltage range of the input signal is not changed, and the gain signal is doubled, and has a range of 0.3V~1.7V, 0.3V then corresponds to the digital value 0 after conversion, and 1.0V corresponds to a digital value 128 after conversion. In view of the input terminal, the input signal is not changed. However, in view of the digital values after the analog-to-digital conversion, the voltage range of the input signal is reduced for 50%. Therefore, by adjusting the voltage range of gain signal (the reference voltage of the analog-to-digital converter), the gain of the input signal then may be adjusted, and therefore the reference voltage of the analog-to-digital converter is referred to as the gain signal.

Further, assuming the voltage range of the input signal is not changed, the gain signal is reduced for 50%, and the range thereof is 0.3V~0.65V. Then, 0.3V corresponds to the digital value 0 after conversion, though 0.65V~1.0V all correspond to the digital value 255 after conversion, which represents a serious distortion, since the output signal cannot integrally present a content of the input signal. Assuming the voltage range of the input signal is not changed, and the voltage range of the gain signal is just the same to the voltage range of the input signal, now, the SNR has a maximum value. As the gain signal gradually increases, value of the SNR then gradually decreases, and therefore an essence of the present invention is to adjust the gain signal for the channel of each input signal to an optimal value.

It should be noted that the gain signals GAIN1~GAIN3 are not necessarily generated by converting digital gain setting signals GSET1~GSET3 via the gain digital-to-analog converters 340~360, and the analog gain signals GAIN1~GAIN3 may be directly provided to the gain multiplexer 320. Such direct providing of the analog gain signals may be implemented by dividing voltages via a series of resistors, and the gain signal may be dynamically adjusted via a variable resistor connected therein. Such implementing method is known by those skilled in the art, and therefore detailed description thereof is not repeated.

Figure 4:
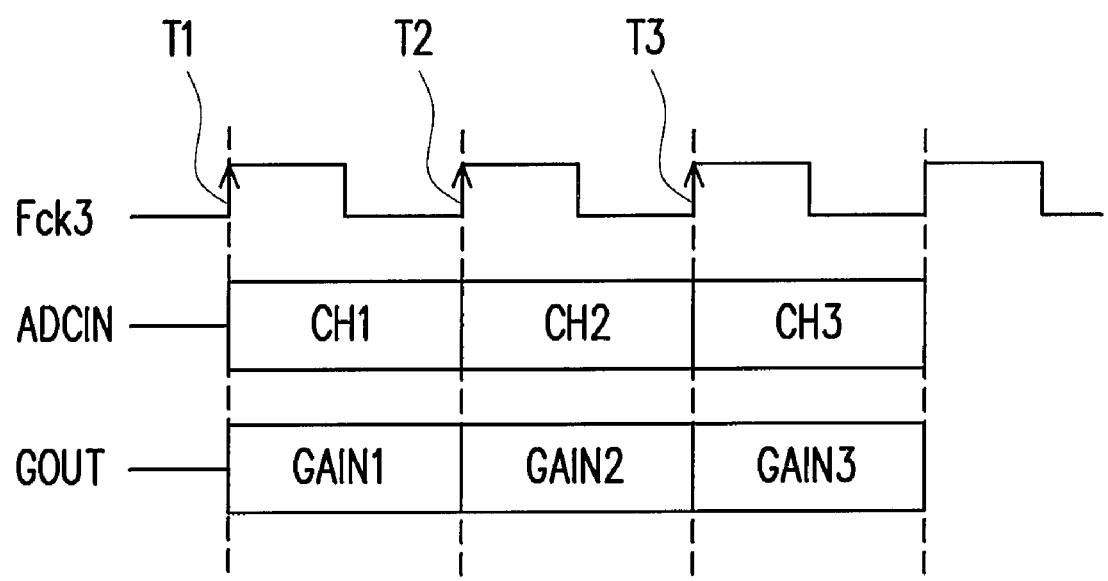
FIG. 4 is a waveform diagram of the analog-to-digital conversion apparatus 300.

Referring to FIG. 4, FIG. 4 is a waveform diagram of the analog-to-digital conversion apparatus 300. Wherein, ADCIN is the sample multiplexing signal output from the input multiplexing module 310, and GOUT is the gain multiplexing signal output from the gain multiplexer 320. According to FIG. 4, it is obvious that at a rising edge trigger point T1 of the clock signal Fck3, the sample multiplexing signal ADCIN output from the input multiplexing module 310 is a sampled signal of the image signal CH1, and the gain multiplexing signal GOUT output from the gain multiplexer 320 is the gain signal GAIN1. Similarly, at rising edge trigger points T2 and T3 of the clock signal Fck3, the sample multiplexing signals ADCIN output from the input multiplexing module 310 are respectively sampled signals of the image signals CH2 and CH3, and the gain multiplexing signals GOUT output from the gain multiplexer 320 are then respectively the gain signal GAIN2 and GAIN3.

Figure 5:
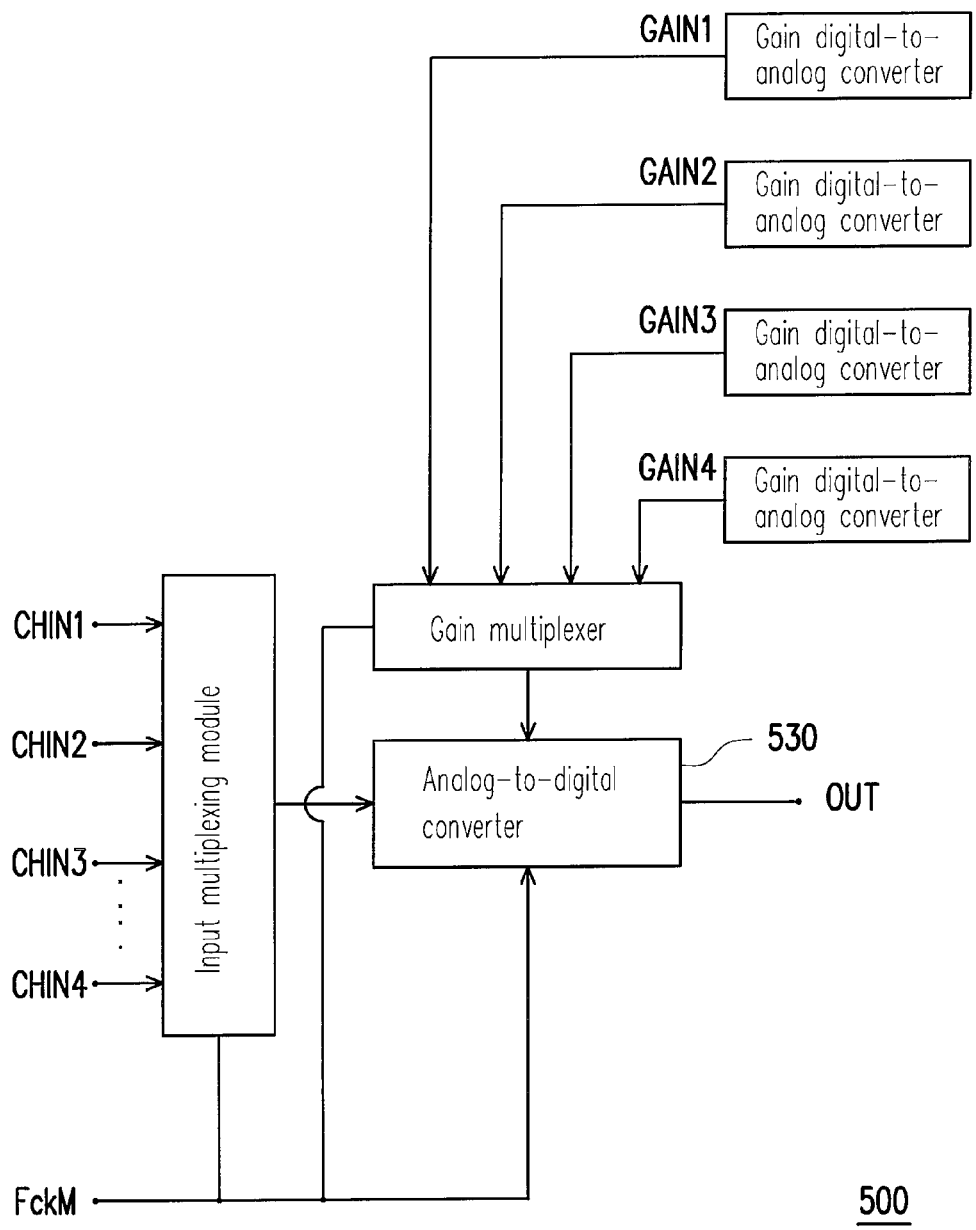
FIG. 5 is a block diagram illustrating a time-interleaved analog-to-digital conversion apparatus 500 according to another embodiment of the present invention.

Next, referring to FIG. 5, FIG. 5 is a block diagram illustrating a time-interleaved analog-to-digital conversion apparatus 500 according to another embodiment of the present invention. Not only three input signals is received by the analog-to-digital conversion apparatus 500 of the present invention, but a plurality of input signals CHIN1~CHIN4 is received. Moreover, corresponding to the plurality of input signals, a plurality of gain signals GAIN1~GAIN4 is received. Similar to the analog-to-digital conversion apparatus 300 of the aforementioned embodiment, the analog-to-digital conversion apparatus 500 also select the sampled input signal and the corresponding gain signal according to a clock signal FckM with a time-interleaved approach. Next, analog-to-digital conversion and amplification of the signals are performed via an analog-to-digital converter 530, so as to obtain a digital signal OUT.

Detailed operation of the analog-to-digital conversion apparatus 500 is similar to that of the analog-to-digital conversion apparatus 300 of the aforementioned embodiment, and therefore detailed description thereof will not be repeated.

In summary, by selecting a plurality of gain signals via the gain multiplexer, different kind of input signal may be suitably amplified during the analog-to-digital conversion according to the corresponding gain signal, so that the SNR of each kind of the input signal may be increased. Moreover, by applying the time-interleaved analog-to-digital conversion apparatus, and by selecting the plurality of gain signals, analog-to-digital conversion of the image signals of the television system is performed, by which not only qualities of the signals are improved, but also circuit area and fabrication cost are effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A time-interleaved analog-to-digital conversion apparatus, adapted to a television system, comprising:
    an input multiplexing module, for receiving a plurality of image signals, and sampling the plurality of image signals according to a clock signal, so as to generate a sample multiplexing signal;
    a gain multiplexer, coupled to the input multiplexing module for receiving a plurality of gain signals and selectively outputting one of the gain signals corresponding to the sample multiplexing signal according to the clock signal, so as to generate a gain multiplexing signal; and
    an analog-to-digital converter, coupled to the input multiplexing module and the gain multiplexer for receiving the sample multiplexing signal, the gain multiplexing signal and the clock signal, and converting the sample multiplexing signal into a digital signal according to the gain multiplexing signal and the clock signal.

2. The time-interleaved analog-to-digital conversion apparatus as claimed in claim 1, wherein the image signals comprise a luminance signal, a first chrominance signal and a second chrominance signal.

3. The time-interleaved analog-to-digital conversion apparatus as claimed in claim 2, wherein the input multiplexing module comprises:
    a first sample-and-hold (S/H) circuit, for receiving the luminance signal and sampling the luminance signal according to the clock signal to generate a first sample signal;
    a second S/H circuit, for receiving the first chrominance signal and sampling the first chrominance signal according to the clock signal to generate a second sample signal;
    a third S/H circuit, for receiving the second chrominance signal and sampling the second chrominance signal according to the clock signal to generate a third sample signal; and
    a multiplexer, coupled to the first, the second and the third S/H circuits for selectively outputting one of the first, the second and the third sample signals according to the clock signal, so as to generate the sample multiplexing signal.

4. The time-interleaved analog-to-digital conversion apparatus as claimed in claim 1, wherein the input multiplexing module comprises:
    a multiplexer, for receiving the plurality of image signals and selectively outputting one of the image signals according to the clock signal to generate a multiplexing signal; and
    a S/H circuit, coupled to the multiplexer for sampling the multiplexing signal according to the clock signal to generate the sample multiplexing signal.

5. The time-interleaved analog-to-digital conversion apparatus as claimed in claim 1, wherein the input multiplexing module comprises:
    a plurality of S/H circuits, for receiving the image signals and sampling the image signals according to the clock signal to generate a plurality of sample signals; and
    a multiplexer, coupled to the S/H circuits for selectively outputting one of the sample signals according to the clock signal to generate the sample multiplexing signal.

6. The time-interleaved analog-to-digital conversion apparatus as claimed in claim 1, wherein the input multiplexing module comprises at least one S/H circuit for receiving the image signals and sampling/holding the image signals according to the clock signal to generate a plurality of sample signals.

7. The time-interleaved analog-to-digital conversion apparatus as claimed in claim 1, wherein the gain signals are analog signals.

8. The time-interleaved analog-to-digital conversion apparatus as claimed in claim 7 further comprising:
   a plurality of gain digital-to-analog converters, for receiving a plurality of gain setting signals and converting the gain setting signals to generate the gain signals, wherein the gain setting signals are digital signals.

9. The time-interleaved analog-to-digital conversion apparatus as claimed in claim 1, wherein the analog-to-digital converter determines a value range of the digital signal according to the gain multiplexing signal.

10. A time-interleaved analog-to-digital conversion apparatus, comprising:
   an input multiplexing module, for receiving a plurality of input signals, and sampling the input signals according to a clock signal to generate a sample multiplexing signal;
   a gain multiplexer, coupled to the input multiplexing module for receiving a plurality of gain signals and selectively outputting one of the gain signals corresponding to the sample multiplexing signal according to the clock signal, so as to generate a gain multiplexing signal; and
   an analog-to-digital converter, coupled to the input multiplexing module and the gain multiplexer for receiving the sample multiplexing signal, the gain multiplexing signal and the clock signal, and converting the sample multiplexing signal into a digital signal according to the gain multiplexing signal and the clock signal.

11. The time-interleaved analog-to-digital conversion apparatus as claimed in claim 10, wherein the input multiplexing module comprises:
   a multiplexer, for receiving the plurality of input signals and selectively outputting one of the input signals according to the clock signal to generate a multiplexing signal; and
   a S/H circuit, coupled to the multiplexer for sampling the multiplexing signal according to the clock signal to generate the sample multiplexing signal.

12. The time-interleaved analog-to-digital conversion apparatus as claimed in claim 10, wherein the input multiplexing module comprises:
   a plurality of S/H circuits, for receiving the input signals and sampling the input signals according to the clock signal to generate a plurality of sample signals; and
   a multiplexer, coupled to the S/H circuits for selectively outputting one of the sample signals according to the clock signal to generate the sample multiplexing signal.

13. The time-interleaved analog-to-digital conversion apparatus as claimed in claim 10, wherein the input multiplexing module comprises at least one S/H circuit for receiving the input signals and sampling/holding the input signals according to the clock signal to generate a plurality of sample signals.

14. The time-interleaved analog-to-digital conversion apparatus as claimed in claim 10, wherein the gain signals are analog signals.

15. The time-interleaved analog-to-digital conversion apparatus as claimed in claim 14 further comprising:
   a plurality of gain digital-to-analog converters, for receiving a plurality of gain setting signals and converting the gain setting signals to generate the gain signals, wherein the gain setting signals are digital signals.

16. The time-interleaved analog-to-digital conversion apparatus as claimed in claim 10, wherein the analog-to-digital converter determines a value range of the digital signal according to the gain multiplexing signal.

17. A time-interleaved analog-to-digital conversion apparatus, comprising:
   an input multiplexing module, for receiving a plurality of input signals, and multiplexing the input signals according to a clock signal to generate an input multiplexing signal;
   a gain multiplexer, coupled to the input multiplexing module for receiving a plurality of gain signals and selectively outputting one of the gain signals corresponding to the input multiplexing signal according to the clock signal, so as to generate a gain multiplexing signal; and
   an analog-to-digital converter, coupled to the input multiplexing module and the gain multiplexer for sampling the input multiplexing signal to generate a sample signal, and converting the sample signal into a digital signal according to the gain multiplexing signal and the clock signal.

18. The time-interleaved analog-to-digital conversion apparatus as claimed in claim 17, wherein the input signals comprise a luminance signal, a first chrominance signal and a second chrominance signal.

19. The time-interleaved analog-to-digital conversion apparatus as claimed in claim 17, wherein the analog-to-digital converter comprises at least one S/H circuit for receiving the input signals and sampling/holding the input signals according to the clock signal to generate the sample signal.

20. The time-interleaved analog-to-digital conversion apparatus as claimed in claim 17, wherein the gain signals are analog signals.

21. The time-interleaved analog-to-digital conversion apparatus as claimed in claim 20 further comprising:
   a plurality of gain digital-to-analog converters, for receiving a plurality of gain setting signals and converting the gain setting signals to generate the gain signals, wherein the gain setting signals are digital signals.

22. The time-interleaved analog-to-digital conversion apparatus as claimed in claim 17, wherein the analog-to-digital converter determines a value range of the digital signal according to the gain multiplexing signal.

* * * * *